United States Patent [19]
Hathaway et al.

[11] Patent Number: 5,963,728
[45] Date of Patent: Oct. 5, 1999

[54] METHOD TO PARTITION CLOCK SINKS INTO NETS

[75] Inventors: David James Hathaway, Underhill Center, Vt.; Roger Sherman Rutter, Johnson City, N.Y.

[73] Assignee: International Business Machines Corporation, Armonk, N.Y.

[21] Appl. No.: 08/696,555

[22] Filed: Aug. 14, 1996

[51] Int. Cl.$^6$ ............................................. G06F 17/50
[52] U.S. Cl. ............................ 395/500.04; 395/500.07
[58] Field of Search ............................. 364/488, 489, 364/490, 491

[56] References Cited

U.S. PATENT DOCUMENTS

| | | | |
|---|---|---|---|
| 4,495,559 | 1/1985 | Gelatt, Jr. et al. | 364/148 |
| 4,615,011 | 9/1986 | Linsker | 364/491 |
| 4,713,773 | 12/1987 | Cooper et al. | 364/491 |
| 4,860,322 | 8/1989 | Lloyd | 375/107 |
| 5,077,676 | 12/1991 | Johnson et al. | 364/489 |
| 5,109,168 | 4/1992 | Rusu | 307/480 |
| 5,159,682 | 10/1992 | Toyonaga et al. | 395/500 |
| 5,164,907 | 11/1992 | Yabe | 364/491 |
| 5,210,700 | 5/1993 | Tom | 364/489 |
| 5,218,551 | 6/1993 | Agrawal et al. | 364/489 |
| 5,235,521 | 8/1993 | Johnson et al. | 364/489 |
| 5,272,729 | 12/1993 | Bechade et al. | 375/118 |
| 5,308,798 | 5/1994 | Brasen et al. | 437/250 |
| 5,339,253 | 8/1994 | Carrig et al. | 364/489 |
| 5,349,536 | 9/1994 | Ashtaputre et al. | 364/491 |
| 5,361,214 | 11/1994 | Aoki | 364/490 |
| 5,397,749 | 3/1995 | Igarashi | 437/250 |
| 5,402,356 | 3/1995 | Schaefer et al. | 364/489 |
| 5,410,491 | 4/1995 | Minami | 364/491 |
| 5,428,764 | 6/1995 | Maskas | 395/550 |
| 5,469,366 | 11/1995 | Yang et al. | 364/489 |
| 5,519,351 | 5/1996 | Matsumoto | 327/295 |
| 5,555,188 | 9/1996 | Chakradhar | 364/490 |
| 5,636,372 | 6/1997 | Hathaway et al. | 395/555 |
| 5,638,291 | 6/1997 | Li et al. | 364/490 |
| 5,644,499 | 7/1997 | Ishii | 364/489 |

OTHER PUBLICATIONS

IEEE Transaction on Computer–Aided Design, Vo. CAD–2, No. 4, Oct. 1983, "Global Wiring by Simulated Annealing", Mario P. Vecchi, pp. 215–222.

Science, May 13, 1983, vol. 220, No. 4598, "Optimization by Simulated Annealing", S Kirkpatrick et al., pp. 671–680.

IEEE Transactions on Computer–Aided Design, vol. CAD–6, No. 2, Mar. 1987, "Thermodynamic Optimization of Block Placement", Patrick Siarry et al., pp. 211–221.

IBM TDB, vol. 33, No. 8, Jan. 1991, "Method for Optimizing Clock Trees on VLSI Chips", pp. 288–291.

IBM Research Disclosure n299, Mar. 1989, Method to Achieve Equal Capacitance on a Group of Nets During Circuit Layout and Placement, no pg. #s.

"A Combined Heirarchal Placement Algorithm" by Shin, Kim . . . No. 1063–6757/93 pp. 164–169, 1993.

"An Algorithm for the Place–and–Route problem in the layout of analog circuits" by Prieto, Quintana . . . pp. 491–494, 1994.

"Analytic Annealing for Macrocell Placement Optimization" by Mir and Inam from Computers Elect. Engng Vol. 22 No. 2, pp. 169–177, 1996 Elseiver Science Ltd.

(List continued on next page.)

Primary Examiner—Kevin J. Teska
Assistant Examiner—Leigh Marie Garbowski
Attorney, Agent, or Firm—Richard M. Goldman; John R. Pivnichny

[57] ABSTRACT

A method of designing the clocking circuitry of an integrated circuit chip. The load sinks are assigned to clock nets, each clock net having less then a maximum load. The first step is selecting a pair of clock nets for improvement. Next, a subset of the load sinks of the pair of clock nets are assigned to each clock net. Thereafter, the unassigned load sinks are assigned in all possible combinations to each of the pair of clock nets. A penalty function for each load sink assignment, and the assignment having the best penalty function is kept.

18 Claims, 5 Drawing Sheets

OTHER PUBLICATIONS

"Using Simulated Annealing to Solve Routing & Location Problems" by Golden & Skiscim Naval Research Logistics Quarterly vol.33, pp. 261–279,(1986).

"Optimization by Simulated Annealing: Quantitative Studies" by Kirkpatrick Journal of Statistical Physics, vol. 34, Nos5/6,1984,pp. 975–987.

"Geographical Data Sturctures Compared A Query". . . by Rosenberg IEEE Trans on Computer–Aided Design vol. CAD–4 No. 1, Jan. 85,pp. 53–67.

"Performance–Driven Clock Net Routing" by Chou & Cheng USC San Diego pp. 429–435, no date.

"Parallel Implementation of Simulated Annealing Using Tansaction Processing". . . by Pao City Polytechnic of Hong Kong pp. 72–76, no date.

"Clock System Design of High Speed Integrated Circuits" by Narayan, Electronic Engineering Oct., 1994, pp. 39–42.

"An Exact Zero–Skew Clock Routing Algorithm" by Tsay, IEEE Trans on Computer–Aided Design vol. 12, No. 2, Feb. 1993, pp. 242–249.

"Zero–Skew Clock Routing Trees With Minimum Wirelengh" by Boese & Kahng 0–7803–0768–Feb. 1992 IEEE, pp. 17–21, 1992.

Research Report RC11323 (#51009) Aug. 16, 1985 Mathematics by Solla, Sorkin, & White "Configuration Space Analysis for Optimization Problems," 11 pages.

Research Report RC 10661 (#47856) Aug. 6, 1984 Computer Science by White, "Concepts of Scale in Stimulate Annealing," 10 pages.

Research Report RC10258 (#45648) Nov. 17, 1983 Computer Science, by Kirkpatrick, "Optimization by Simulated Annealing". . . 15 pages.

Research Report RC9555 (#42209) Sep. 1, 1982 Computer Science/Engineering Tech by Vecchi & Kirkpatrick,"Global Wiring by Simulate Annealing" 19 pages.

Research Report RC9355 (#41093) Apr. 2, 1982 Computer Science/Engineering Technology by Kirkpatrick, Gelatt & Vecchi Optimization by"Simulated Annealing" 48 pages.

Research Report RC16244 (#72119) Nov. 1, 1990 Computer Science by Tsay,"An analytic net weighting approach for performance optimization". . . 12 pages.

"SAGA: A unification of the Genetic Algorithm". . . by Ebensen & Mazumder 0–8186–4990–91–94, 1994 IEEE, pp. 211–214.

ASSIGN A UNIQUE INDEX TO EACH NET, 1 TO n, THE
NUMBER OF NETS FOR i=1 TO n-1

PRIMARY NET = NET(i)
    CALCULATE THE COST OF THE PRIMARY NET

FOR j=i+1 TO n

SECONDARY NET = NET(j)
        IF DISTANCE BETWEEN CURRENT NET AND
        SECONDARY NET > RANGE THEN ITERATE
        CALCULATE THE COST OF THE SECONDARY NET
        ENTER PINS THAT CAN BE ASSIGNED ON AN
        ASSIGNABLE PIN LIST
        ASSIGN PINS TO NETS BY ALGORITHM 1
        ASSIGN PINS TO NETS BY ALGORITHM 2
        CALCULATE THE COST OF THE RECONFIGURED NETS
        IF NEW COST < OLD COST
        THEN REPLACE OLD CONFIGURATION WITH NEW
        ELSE RESTORE THE OLD CONFIGURATION

FIG. 2(a)

ALGORITHM 1

MOVE ALL PINS THAT CAN BE ASSIGNED TO ANOTHER NET TO A REASSIGNABLE PIN LIST

IF NEITHER NET HAS ANY PINS REMAINING UNASSIGNED THEN ASSIGN THE FURTHEST SEPERATED PINS, ONE TO EACH NET

ELSE IF EITHER NET HAS NO PIN ASSIGNED TO IT, THEN ASSIGN THE PIN FURTHEST FROM THE OTHER NET TO IT

DO WHILE THE NUMBER OF REASSIGNABLE PINS > FREE_PINS

FIND THE BEST CANDITATE FOR EACH NET, FOR EXAMPLE THE PIN NEAREST THE NET AND FURTHEST FROM THE OTHER

ASSIGN ONE BEST CANDIDATE TO ONE NET SUCH THAT THE CAPACITANCE OF THE HIGHER CAPACITANCE NET IS THE LOWEST

ALGORITHM 2

FOR ALL POSSIBLE ASSIGNMENT OF REMAINING REASSIGNABLE PINS

CALCULATE THE COST OF THE CURRENT ASSIGNMENT IF THE COST IS LESS THAN THE PREVIOUS BEST COST THEN SAVE THE CONFIGURATION

METHOD TO PARTITION CLOCK SINKS INTO NETS

FIELD OF THE INVENTION

The invention relates to clocked circuits. In the logical design of clocked circuits, as distinguished from the physical design or actual manufacturing thereof, sets of clock signals are assumed to arrive at their latches simultaneously. However, this is not the actual situation. Device or gate capacitances, and line capacitances and resistances cause the clock signals to arrive at different gates at different times, i.e., they skew the clock signal. Many of these capacitances and resistances arise during physical design and manufacturing. According to the invention clock nets and clocking circuit load sinks are designed to minimize clock skew. The invention provides an initial assignment of sinks to clock nets. This is followed by a refinement phase characterized by merging and repartitioning pairs of nets and by deleting and adding nets. The same techniques can also be applied to non-clock logic trees to reduce worst case delay and/or wire length. The resulting lower capacitances will also reduce chip power consumption. The method of the invention is faster than and produces better results than simulated annealing.

BACKGROUND OF THE INVENTION

During chip logic design, sets of clock signals, i.e., clock sets, are assumed to arrive at all of their latches at the same time by timing analysis. However, this does not happen. There is clock skew. Clock skew is the variation in effective arrival time of the clock signal at different clocked elements. These variations in clock signal arrival time, that is, clock skew, may be due to one or more effects: different threshold voltages, signal propagation delays on wires, and variation in element delays. The time required for signals, such as clock signals, to propagate on wires in MOSFET technologies is not determined by "speed of light" considerations, except for the very shortest of wires. Rather, clock skew is determined by resistivity and capacitance of the wires and parasitic capacitance. Thus it is essential that, during the subsequent physical design, a clock tree that realizes the objective of effectively controlling clock skew be designed.

There are several approaches to realizing substantially simultaneous arrival of clock signals:
1. partition the clock sinks into nets, place sources for these nets, then continue this process until a single source is reached; or
2. design a clock distribution tree, and then partition clock sinks to the outputs of the clock tree; or
3. a mix of the above approaches.

Other delay balancing approaches exist, but they often rely on adding capacitance, resistance, or additional loads, i.e., wire or passive device load, to achieve balance.

One partitioning objective is to create nets with equal delay. Usually, this cannot be completely realized on any net from its source to its sinks, nor on different nets. Delay is a function of many components, but given multiple copies of a single circuit as net sources and nets that are not physically very large, capacitance and wire length are the dominant factors. A second partitioning objective is to reduce clock tree wire length.

Net capacitance is the sum of two components, (1) the gate capacitance of the sinks in the net, and (2) the capacitance of the wire needed to connect the sinks. The total gate capacitance of the sinks at a stage of the clock tree may or may not be known, especially where the earlier stages are a function of the later stages. The wire capacitance needed to interconnect the sinks depends upon the partitioning of the sinks into nets. For critical clocks, the capacitance of each net must meet both an upper bound and a lower bound. For other clocks and for logic repowering trees, only an upper bound need be met.

Current clock trees are very large, having three thousand or more latch sinks. These sinks must be partitioned into nets with fairly low fanouts to keep capacitance as the main delay variable. Thus, many nets must be defined, each typically with up to twenty five or more sinks per net.

The problem is one of given a large number of sinks, for example, three thousand sinks and a large number of nets, for example, two hundred nets, find the minimum wire length solution with every net having substantially equal net loadings within given limits, and possibly with every net having a maximum number of sinks, for example, twenty five or less sinks. Clearly, this problem grows as a factorial. When the number of nets and the number of sinks per net can or must vary (because of different gate capacitances), the problem is larger. Thus, computational performance is a further problem.

One method heretofore used to accomplish this task is simulated annealing. Simulated Annealing is a slow, computation intensive process.

OBJECTS OF THE INVENTION

Thus, it is one object of the invention to provide a method of designing the clocking circuitry of an integrated circuit chip where the load sinks are assigned to clock nets, and each clock net has less then a maximum load.

It is a further object of the invention to provide a method of designing the clocking circuitry of an integrated circuit chip where the load sinks are assigned to clock nets, the number of clock nets being less then a pre-set maximum.

It is a still further object of the invention to minimize the wire length required by the clock nets while balancing the loads of the clock nets.

It is a still further object of the invention to accomplish the above objects in a rapid process.

SUMMARY OF THE INVENTION

The above objectives of the invention are achieved by the method of the invention which reduces clock skew.

A first method for initial clock sink assignment is used when we wish to restrict each clock net to a maximum load (generally to include wire loading) or fanout. We start by selecting a sink at random and assign it to the first net. We then add to that net the unassigned sink which is closest to the set of sinks already assigned to the net repeating this process until the fanout or estimated load of the net exceeds the desired limit. At that point the last sink added to the net is removed from the net and is assigned to the next net. Other sinks are added to this net in a similar manner, and the process continues until all sinks have been assigned. If there are not enough nets in the design, new nets and net source buffers will be added by making a parallel copy of one of the original clock nets and its source buffer. If too many nets exist, the extra nets will be deleted, along with their source buffers. Once net sinks have been assigned, the driving buffer is placed at the center of the sinks.

The second method for initial clock sink assignment is used when we wish to restrict ourselves to a predetermined number of clock nets. We first build a geometric tree structure containing all the clock sink locations, and mark each vertex in the tree with the estimated net load which would be required if all the sinks in the subtree rooted at that node were to be fed by a single net. We then create a heap data structure which will contain tree nodes sorted by their estimated subtree load, such that the node with the maximum load will remain at the root of the heap, and insert the tree root in this heap. We also set a counter of the number of nets identified to one. We will now enter a loop in which we pull the top node off the heap (which will correspond to the set of sinks which, if wired as a single net, would have the largest load), divide the subtree for which it is the root, place the roots of the pieces back on the heap, and increment the net counter, continuing until the desired number of nets have been identified.

By repeating either of these processes for every level of the clock tree, beginning at the leaves and proceeding backward to the root, a reasonable initial clock tree can be constructed.

According to our invention, we provide a method of designing the clocking circuitry of an integrated circuit chip where load sinks are assigned to clock nets, and each clock net has less then a maximum load. The iterative phase of the method starts by selecting a pair of clock nets for improvement of an objective function or a penalty function. This is followed by assigning a subset of the load sinks of the pair of clock nets to each of these clock nets. The load sinks that are not in the subset so assigned are assigned in all possible combinations to each of the pair of clock nets first selected. A penalty function is calculated for each load sink assignment and the assignment having the best penalty function is kept.

An alternative method of our invention is to use the iterative phase with an arbitrary initial assignment. This method applies, especially if the clock trees have been logically and physically designed up to the final stage. In this case there is no need to predict the number of nets to be used, so the constructive stage can be reasonably skipped. The clock tree can be reasonably designed up to the last stage, perhaps trading some efficiency for better skew control to that point and simpler final processing.

THE FIGURES

The invention may be understood by reference to the FIGURES.

FIG. 1 is a high level flow chart of the method of our invention showing an initial partitioning of clock sinks and subsequent refinement and rebalancing stages.

FIGS. 2A and 2B show pseudo code for one embodiment of the invention providing good local solutions. As shown two nets are improved at a time. The objective is to rearrange the sinks of the two nets to lower a total objective function score. The rearrangement is done in two steps. The first step assigns sinks to each net. The second step assigns the remaining sinks to one or both nets in all possible combinations. Clearly, the second step may require significant computation if there are more than just a small number of sinks not assigned by the first step and if this step is used frequently. A controllable limit, free_pins, defines the number of sinks to not assign in the first step. Free_pins may be zero.

FIG. 3A and 3B shows a flow chart for a smoothing method of refining the initial assignment. In this embodiment the desired number of nets is the sum of the net loads divided by the target capacitance. This iterative process is carried out in a "process_region" recursive process. In the recursive process a check is done to see if the desired number of nets is less than the current number of nets, that is, are nets to be deleted. If so, a subroutine is entered in which a further test is done, and nets may be deleted. If not, a test a carried out to determine if nets are to be added. The region and the net list are then divided in two, the desired number of nets is calculated for each half of the region, and "process_region" is entered again.

DETAILED DESCRIPTION OF THE INVENTION

Clock skew is a serious problem in VLSI circuits. Any approach to reducing or eliminating clock skew requires that two problems be solved. These are similarity of net load and program performance. The methods described herein address both of these concerns.

Figure 1:
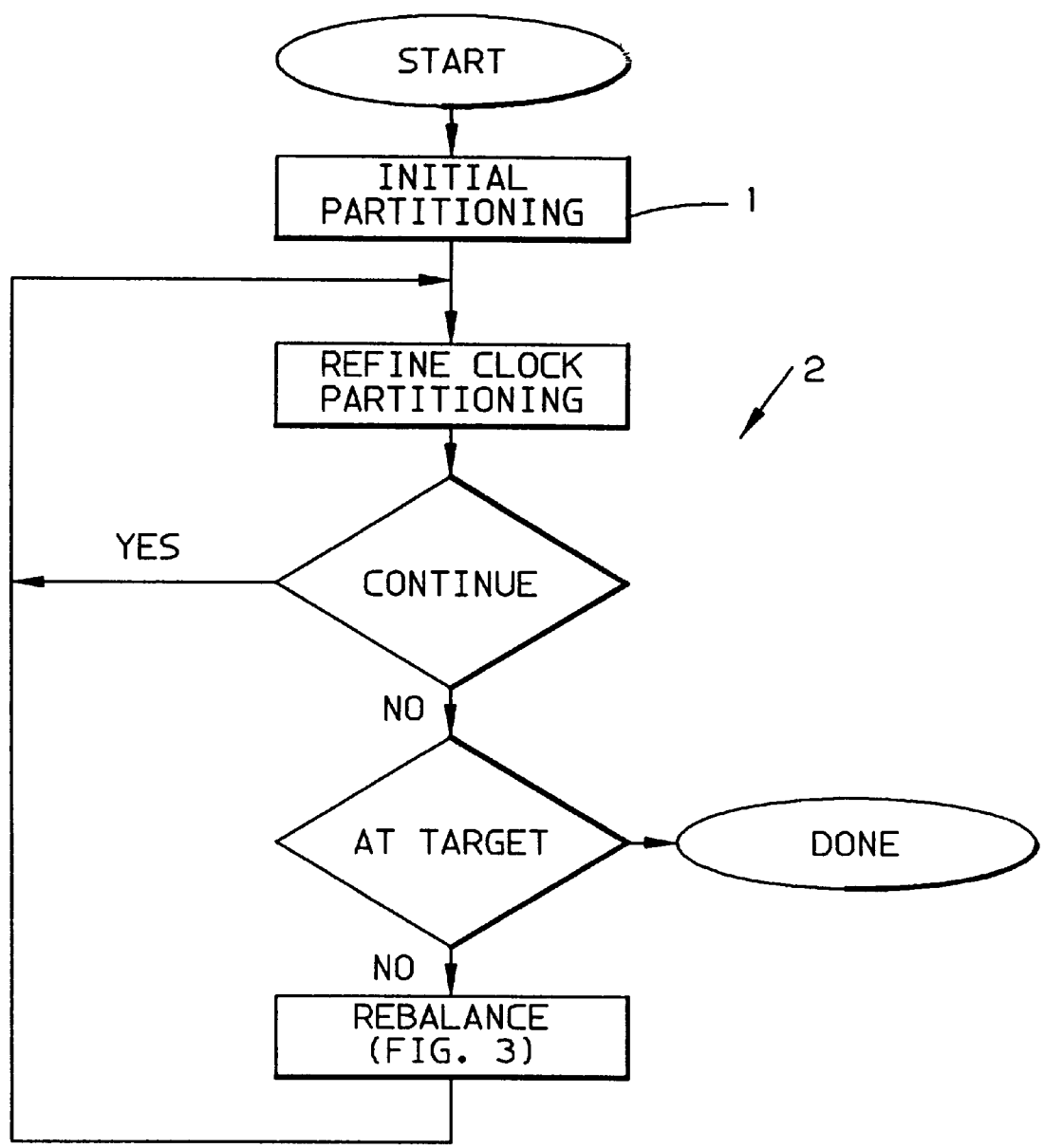

The initial assignment of sinks to clock nets, as shown in element 1 of FIG. 1, can be done in one of two ways, either construction (adding nets until a limit is reached) or division (repeated dividing of nets). Alternatively, random partitioning of nets can be utilized for initial assignment. By "partitioning" is meant assignment of pins to nets. These initial assignments are not intended to give a final solution, but instead yield a starting point from which we can start the iterative improvement process, as shown in element 2 of FIG. 1. By getting a good starting point, we require fewer improvement passes.

Both of these initial assignment methods can make use of geometric tree data structure (e.g., k-D tree or quad-tree), and the second method depends on the use of a geometric tree structure. These well-known data structures can be used to efficiently organize data objects (e.g., clock sinks) in a geometric space (e.g., a chip area). In each of these data structures, the root of the tree can give access to objects anywhere in the space, and successively deeper subtrees only give access to objects in successively smaller regions of the space.

The first method of our invention is a computationally very fast algorithm for initial clock sink assignment and is used when we wish to restrict each clock net to a maximum load (generally to include wire loading) or fanout. We start by selecting a sink at random and assign it to a first net. We then add to that net the unassigned sink which is closest to the set of sinks already assigned to the net (this can be done efficiently using the tree structures described above), repeating this process until the fanout or estimated load of the net exceeds the desired limit. At that point the last sink added to the net is removed from the net and is assigned to the next net. Other sinks are added to this net in a similar manner, and the process continues until all sinks have been assigned. If there are not enough nets in the design, new nets and net source buffers will be added by making a parallel copy of one of the original clock nets and its source buffer. If too many nets exist, the extra nets will be deleted, along with their source buffers.

The second method for initial clock sink assignment is used when we wish to restrict ourselves to a predetermined number of clock nets. We first build a geometric tree structure containing all the clock sink locations, and mark each vertex in the tree with the estimated net load which would be required if all the sinks in the subtree rooted at that node were to be fed by a single net. We then create a heap data structure which will contain tree nodes sorted by their estimated subtree load, such that the node with the maximum load will remain at the root of the heap, and insert the tree root in this heap. We also set a counter of the number of nets identified to one. We will now enter a loop in which we pull the top node off the heap (which will correspond to the set of sinks which, if wired as a single net, would have the largest load), divide the subtree for which it is the root, place the roots of the pieces back on the heap, and increment the net counter by the number of new subtrees created, continuing until the desired number of nets have been identified. When this loop is finished we pull each node off the heap and for each, assign all sinks in its subtree to a single net. The exact method for dividing the tree depends on the exact tree data structure used.

For a k-D tree, we delete the root node and insert the sink stored on the root node into the child subtree of the old root node to which it is closest. The two children of the old root node are the roots of the new subtrees put back on the heap.

For a quad-tree, we can divide the tree in four (corresponding to the four children of the root node) instead of two, incrementing the identified net count by three instead of one, if the identified net count was at least three less than the target. Or, we could divide the tree along either the vertical or horizontal cut at the root node. In either case, we would then assign any sinks which had been associated with the cut line segments to the new subtree(s) to which they were closest.

By repeating this process for each level of the clock tree, beginning at the leaves and proceeding backward to the root, a reasonable initial clock tree can be constructed. Typically, after the initial assignment of sinks to a net, the source is placed at the center of the net.

Figure 3A:
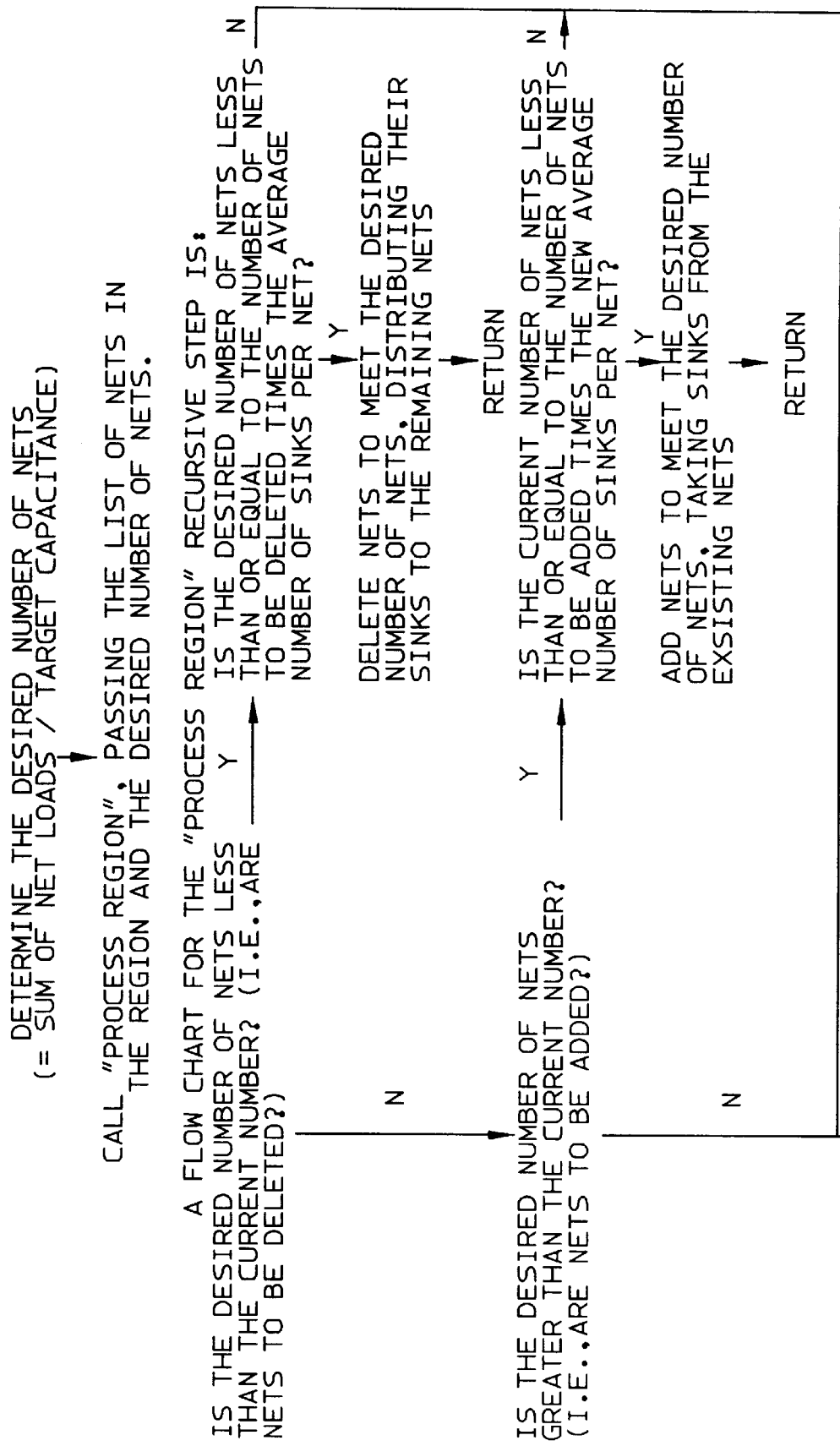
Figures 3A, 3B:
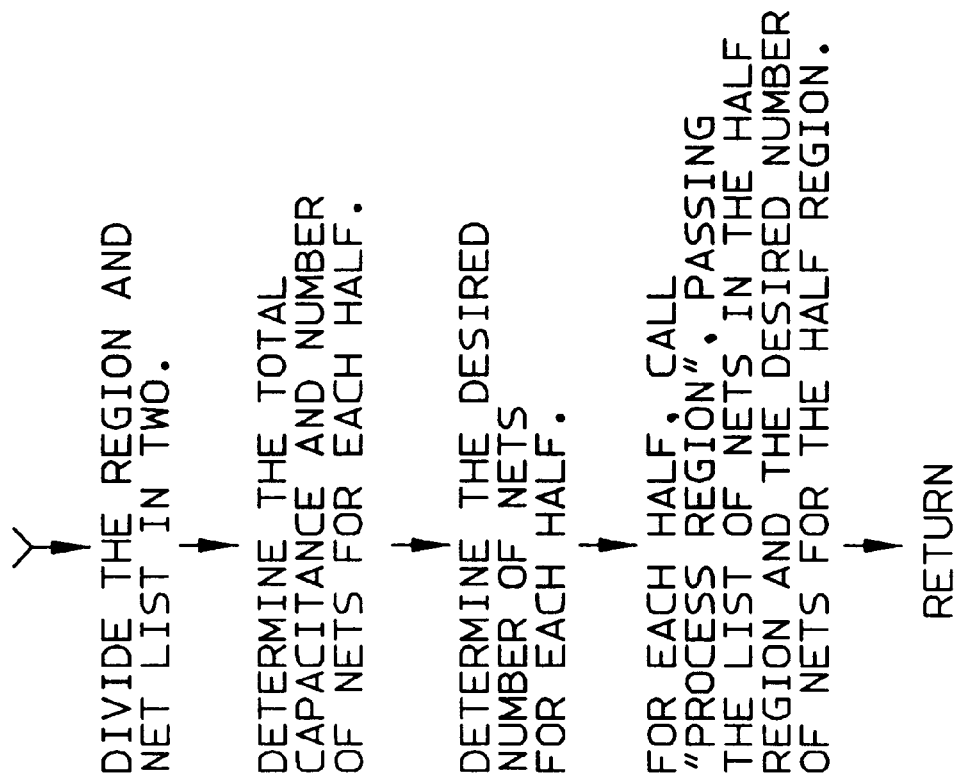

Having an initial partitioning, the iterative improvement phase is started. The iterative improvement phase consists of two parts. The pairwise refinement part shown in FIG. 2 can address either of two objectives: minimize the total wire length of a set of nets, and minimize the difference between the loads of different nets. Each objective can be addressed with a different scoring objective function. The rebalancing part shown in FIG. 3 is used to minimize the difference in load from a target for a set of nets.

As shown in FIG. 2, two nets are improved at a time. The objective is to rearrange the sinks of the two nets to lower a total objective function score. The rearrangement is done in two steps. The first step assigns some of the sinks to each net. The second step assigns the remaining sinks to one or both nets in all possible combinations. Clearly, the second step may require significant computation if there are more than just a small number of sinks not assigned by the first step and if this step is used frequently. A controllable limit, free_pins, defines the number of sinks to not assign in the first step. Free_pins may be zero.

The first step checks whether the number of sinks whose net assignment is not fixed exceeds free_pins, and if so creates partial nets with enough sinks assigned thereto so that the number of remaining sinks equals free_pins. If the nets have sinks that are permanently assigned to one or the other net, these sinks will be assigned to the net in which each initially was. Net sources are permanently assigned to their nets. If there are no sources or fixed sinks then the two sinks that are furthest apart will be assigned, each to one net.

As shown in Algorithm 1 of FIG. 2B, if the number of remaining sinks is greater than free_pins, then one sink will be assigned to one net iteratively until the limit is reached. Two candidate sinks will be found, one for each net. A candidate sink for a net may be chosen such that (1) the distance to the other net from the candidate sink is maximized, (2) the distance from a net to the candidate sink to be added to that net is minimized, or (3) the sum of the distance from the net to the candidate sink minus the distance from the candidate sink to the other net is minimized. Next, the capacitance of each net with the added candidates is estimated. The net with the lower capacitance will have its candidate added to it. This step often produces good results by itself.

Alternatively, a single candidate may be chosen for addition to the net which currently has the lowest capacitance, by one of the three methods described above.

The additional method, shown in Algorithm 2 of FIG. 2B, forms all possible net configurations using the remaining sinks and evaluates each of them. If the best result is better than the initial configuration, it will replace the initial one.

If the above iterative improvement technique is applied to all pairs of nets it will require much computation, especially if free_pins is not zero.

A further control, range, is used with free_pins to reduce the computational load. Range is a distance which may be a user specified parameter or which may be calculated based on the area covered by the net or based on the distance between the load of the net and the target load. If the bounding rectangles of a pair of nets are more distant than the range, iterative improvement will not be applied to the pair.

Initially, a moderate value of range is used with free_pins set to zero. Several iterations through all of the net pairs will produce many nets whose bounding rectangles are some distance from those of most other nets unless there are too many nets and nets are being balanced. Range cannot be reduced until all nets meet the upper bound. If the upper bound cannot be met, then the number of nets may have to be increased. The initial net construction phase guarantees that an upper bound will be met. As range is reduced, the constructive phase limit free_pins can be increased. This permits a more exhaustive exploration of the possible sink assignments on nets with significant overlap, and hence non-obvious solutions. An obvious solution would be one where the bounding rectangles of two nets being iteratively improved are significantly separated.

The above approach is effective at further reducing the total wire length and hence the total capacitance in the network. At this point it should be understood that while "capacitance" and "load" are generally used interchangably, "load" can also mean current as in a current active device, that is, a bipolar transistor, and that the cost function can incorporate wire length, RC product, capacitance, current, or power consumption. There are several solutions to meeting the lower bound. The simplest, and least efficient, is to add passive load to the low nets to bring them up to the lower bound. The passive load may be gates, wire, or a combination thereof. The above technique with an objective function that scores on the difference between the net capacitance and a single target can adjust wire length to lower the difference between the highest and lowest capacitance over all nets. To accomplish this it may be necessary to increase range to permit a non-overlapping net pair to be iteratively improved, since a sink more distant is needed to increase the wire capacitance. We can also increase the wire capacitance by placing the buffer driving the net farther from the sinks of the net. By biasing this placement toward the location of the buffer driving the net source buffer, we can reduce the load on that previous stage buffer while better balancing load on the current stage. Since there are fewer nets at an earlier stage in the clock tree, the total wire or load added will be less if added there.

If many nets are below the lower bound, then it is likely that the number of nets can be reduced, the sinks of the removed nets transferred to other nets, and the resulting configuration iteratively improved. This will likely produce nets with a higher lower bound. This choice will increase net capacitance without requiring the addition of a passive load, but since the number of nets has been reduced, the total tree capacitance will be lower. This choice will increase the capacitance of low capacitance nets without requiring the addition of passive load.

The iterative improvement technique can also be used to remove nets. In this case, the net with low capacitance is selected. Some number of nets near to it are then selected. All sinks on the initially selected net are transferred to its nearest neighbor. Then, all the nets within the selected set, except the initial one are pair-wise improved, iterating a selectable number of times. If the capacitance of the highest net becomes lower than the upper capacitance bound, then net removal was successful. Otherwise, the original configuration is restored and a different initial net is selected to continue attempting removal.

Thus, according to our invention, there is provided a method of designing the clocking circuitry of an integrated circuit chip where load sinks are assigned to clock nets, and each clock net has less than a maximum load. The iterative phase of the method starts by selecting a pair of clock nets for improvement of an objective function or a penalty function. This is followed by assigning a subset of the load sinks of the pair of clock nets to each clock net. The load sinks that have not been so assigned are assigned in all possible combinations to each of the pair of clock nets first selected. A penalty function is calculated for each load sink assignment and the assignment having the best penalty function is kept.

Iterative refinement of pairs of nets will only slowly balance long distance load variations since they will have to diffuse out through repeated chains of net pair improvements. Iterative improvement is also not well suited to achieving a specified target capacitance per net unless net addition and/or removal is performed. A global analysis can help to determine where nets should be added or deleted to solve these problems. One global approach is described above using iterative improvement for net addition and removal. It assumes that a low net occurs in an area with other low nets, and similarly that high nets occur in proximity to other high nets.

As shown in FIG. 3, the first step in global analysis is to determine how many nets need to be added or deleted for the whole cluster. This is zero if the target is the average load, and could be non-zero for a particular target. The simplest approach is to sum the total capacitance of all of the nets and divide by the target capacitance to get the number of nets needed. This assumes that the wire load plus the gate load per sink is approximately constant, independent of the number of nets, which is close to correct if the number of nets is maintained relatively constant. If the target number of nets thus calculated differs from the current number of nets, nets can be added or deleted to make them match.

The number of nets to be added or deleted is allocated through successive divisions of the placement area. After each division the average load is found for each half of the partition. This is then used to determine the number of nets to add or delete from each half, subject to the constraint that the total number of nets added minus the number deleted for the two halves equal the number of nets to be added minus the number to be deleted for the whole partition. Let the sum of the net capacitances for the right and left halves be Ctl and Ctr, respectively, the total number of nets in the left and right halves be Nl and Nr, respectively, the total number of nets to be added or the negative of the number to be deleted for the entire region be dN, and the number to be added or the negative of the number to be deleted from the left and right halves be dNl and dNr, respectively, where dNl+dNr=dN.

The objective of having the equal average capacitances for the two halves is then, $$Ctl/(Nl+dNl)=Ctr/(Nr+dNr)$$

which rearranges to $$Ctl/(Nl+dNl)=Ctr/(Nr+dN-dNl)$$

by the equality of dNl+dNr=dN. Multiplying, $$dNl=(Ctl*(Nr+dN)-Ctr*Nl)/(Ctl+Ctr).$$

If dNr or dNl is positive, nets will be added to the appropriate half, while if either is negative, nets will be deleted from the appropriate half.

These divisions continue until:

If nets are to be deleted from the region, sinks from the deleted nets will be able to be distributed among all of the remaining nets in the region. This is true if the desired number of nets is less than or equal to the number of nets to be deleted times the average number of sinks per net. Or, If the nets are to be added, sinks can be taken from all of the existing nets to form new nets. This is true if the current number of nets is less than or equal to the number of nets to be added times the new average number of sinks per net.

After nets have been added or deleted, the pair-wise iterative improvement process would be repeated.

A flow chart for this process in shown in FIG. 3.

The above techniques may be applied either interactively or under control of an optimization scenario. Interactive use can be very effective because the operation and limits can fit the current conditions.

The scenario option does not require a user to monitor the execution of the optimization, and a usually successful schedule of steps can be standardized. It does not require constant monitoring and requires less user skill after standardization. Obviously, both implementation can coexist, each offering their particular strengths.

While the invention has been described with respect to certain preferred embodiments and exemplifications, it is not intended to limit the scope of the invention thereby, but solely by the claims appended hereto.

We claim:

1. A method of designing the clocking circuitry of an integrated circuit chip having a plurality of separate clock nets and a plurality of sinks, comprising the steps of:

making an initial assignment of a sink to one of two or more separate clock nets of said integrated circuit chip;

selecting two of said clock nets including all sinks assigned to either of said two clock nets;

removing said all assigned sinks from said two selected clock nets, and re-assigning each of less than said all sinks, to one or the other of said two selected clock nets;

thereafter, forming all possible combinations of re-assigning each of the remaining sinks of said all sinks, to one or the other of said two selected clock nets;

computing the value of a penalty function for each of said all possible combinations of assignment; and keeping that said combination of assignment having the best computed value of said penalty function.

2. The method of claim 1 wherein the step of making an initial assignment further comprises the steps of:

assigning a first sink to a first clock net;

assigning to said first clock net a subsequent sink which is closest to the sinks already assigned to said first clock net and repeating until the total number of sinks exceeds an upper limit;

thereafter, removing the last assigned sink from said first clock net, starting a second clock net, and assigning said last assigned sink to said second clock net; and continuing to assign subsequent sinks which are closest to the set of sinks already assigned to a clock net, starting new clock nets as the total number of sinks in a net exceeds said upper limit, until said each sink has been assigned.

3. The method of claim 1 wherein the step of making an initial assignment further comprises the steps of:

constructing a geometric tree structure having subtrees and tree nodes, said structure containing each sink, and marking each tree node of said geometric tree structure with the estimated load of all sinks in the subtrees rooted at said tree node;

inserting subtree nodes rooted at the root of said geometric tree structure into a heap data structure sorted by said estimated loads;

removing the highest estimated load subtree node from said heap data structure, dividing said subtree node into further subtree nodes rooted at said highest estimated load subtree node, and inserting said divided subtree nodes in said sorted heap data structure;

repeating said removing, dividing, and inserting of the previous step until a desired number of subtree nodes are inserted in said heap; and designating each of said desired number of subtree nodes in said heap as a clock net with the sinks in each of said desired number of subtree nodes taken as said initial assignment of sinks to clock nets.

4. The method of claim 3 wherein said geometric tree structure is constructed as a k-D tree.

5. The method of claim 3 wherein said geometric tree structure is constructed as a quad-tree.

6. The method of claim 1 further comprising selecting two of said clock nets having the shortest distance between said two clock nets.

7. The method of claim 1 wherein the number of said remaining sinks is less than a pre-specified number.

8. The method of claim 7 further comprising selecting two of said clock nets having the shortest distance between said two clock nets.

9. The method of claim 1, further comprising the steps of:

after said keeping said combination step, determining a required number of clock nets for said integrated circuit chip to meet a load-per-clock-net target;

thereafter, either adding additional clock nets and re-assigning sinks from said two or more clock nets to said additional clock nets until said required number of clock nets is reached or a first stopping criteria is met, or deleting clock nets and re-assigning sinks from said deleted clock nets to remaining clock nets until said required number of clock nets is reached or a second stopping criteria is met;

thereafter, dividing said integrated circuit chip into regions of two or more clock nets each so that each clock net lies within a region;

determining a required number of clock nets for each said region to meet said load-per-clock-net target; and for each said region, either adding additional clock nets and re-assigning sinks from said two or more clock nets within said each region to said additional clock nets added to said each region until said required number of clock nets for said each region is reached or said first stopping criteria is met, or deleting clock nets from said each region and re-assigning sinks from said deleted clock nets to remaining clock nets in said each region until said required number of clock nets for said each region is reached or said second stopping criteria is met.

10. The method of claim 9 wherein said required number of clock nets for said integrated circuit chip is determined from the formula:

$$Nr=Ct/Cr$$

where Nr is said required number of clock nets, Ct is a sum of all loads of all clock nets on said integrated circuit chip, and Cr is said load-per-clock-net target.

11. The method of claim 9 wherein said integrated circuit chip is divided into first and second regions and said required number of clock nets for each of said first and second regions is determined from the formulas:

$$Nr1=Nc1+(Ct1*(Nc2+Nr-Nc)-Ct2*Nc1)/(Ct1+Ct2)$$

and $$Nr2=Nr-Nr1$$

where Nr1 and Nr2 are said required number of clock nets for said first and second regions respectively, Nc1 and Nc2 are the number of clock nets in said first and second regions respectively after dividing said integrated circuit chip into regions, Ct1 and Ct2 are the total loads of all clock nets in said first and second regions respectively, Nr is said required number of clock nets for said integrate circuit chip, and Nc is the total number of clock nets on said integrated circuit chip immediately prior to said step of dividing said chip into regions.

12. The method of claim 9, further comprising the steps of:

sub-dividing a region into sub-regions of two or more clock nets each, so that each clock net lies within one of said sub-regions;

determining a required number of clock nets for each said sub-region to meet said load-per-clock-net target; and for each said sub-region, either adding additional clock nets and re-assigning sinks from said two or more clock nets within said each sub-region to said additional clock nets added to said each sub-region until said required number of clock nets for said each sub-region is reached or said first stopping criteria is met, or deleting clock nets from said each sub-region and re-assigning sinks from said deleted clock nets to remaining clock nets in said each sub-region until said required number of clock nets for said each subregion is reached or said second stopping criteria is met.

13. A computer program product containing executable code for execution by a computer for designing the clocking circuitry of an integrated circuit chip having a plurality of separate clock nets and a plurality of sinks, said computer program product comprising:

means for making an initial assignment of each sink to one of two or more separate clock nets;

means for selecting two of said clock nets including all sinks assigned to either of said two clock nets;

means for removing said all assigned sinks from said two selected clock nets, and re-assigning each of less than said all sinks, to one or the other of said two selected clock nets;

means for thereafter forming all possible combinations of re-assigning each of the remaining sinks of said all sinks, to one or the other of said two selected clock nets;

means for computing the value of a penalty function for each said combination of assignment; and means for keeping that said combination of assignment having the best computed value of said penalty function.

14. The computer program product as set forth in claim 13 wherein said means for making an initial assignment further comprises:

means for assigning a first sink to a first clock net;

means for assigning to said first clock net a subsequent sink which is closest to the sinks already assigned to said first clock net and repeating until the total number of sinks exceeds an upper limit;

means for removing the last assigned sink from said first clock net, and for starting a second clock net, and for assigning said last assigned sink to said second clock net; and means for continuing to assign subsequent sinks which are closest to the set of sinks already assigned to a clock net, and for starting new clock nets as the total number of sinks in a net exceeds said upper limit, until said each sink has been assigned.

15. The computer program product as set forth in claim 13 wherein said means for making an initial assignment further comprises:

means for constructing a geometric tree structure having subtrees and tree nodes, said structure containing each sink, and for marking each tree node of said geometric tree structure with the estimated load of all sinks in the subtrees rooted at said tree node;

means for inserting subtree nodes rooted at the root of said geometric tree structure into a heap data structure sorted by said estimated loads;

means for removing the highest estimated load subtree node from said heap data structure, for dividing said subtree node into further subtree nodes rooted at said highest estimated load subtree node, and for inserting said divided subtree nodes in said sorted heap data structure;

means for repeating said removing, dividing, and inserting of the previous step until a desired number of subtree nodes are inserted in said heap; and means for designating each of said desired number of subtree nodes in said heap as a clock net with the sinks in each of said desired number of subtree nodes taken as said initial assignment of sinks to clock nets.

16. A computer system for designing the clocking circuitry of an integrated circuit chip having a plurality of separate clock nets and a plurality of sinks, comprising:

means for making an initial assignment of each sink to one of two or more separate clock nets;

means for selecting two of said clock nets including all sinks assigned to either of said two clock nets;

means for removing said all assigned sinks from said two selected clock nets, and re-assigning each of less than said all sinks, to one or the other of said two selected clock nets;

means for thereafter forming all possible combinations of re-assigning each of the remaining sinks of said all sinks, to one or the other of said two selected clock nets;

means for computing the value of a penalty function for each said combination of assignment; and means for keeping that said combination of assignment having the best computed value of said penalty function.

17. The computer system as set forth in claim 16 wherein said means for making an initial assignment further comprises:

means for assigning a first sink to a first clock net;

means for assigning to said first clock net a subsequent sink which is closest to the sinks already assigned to said first clock net and repeating until the total number of sinks exceeds an upper limit;

means for removing the last assigned sink from said first clock net, and for starting a second clock net, and for assigning said last assigned sink to said second clock net; and means for continuing to assign subsequent sinks which are closest to the set of sinks already assigned to a clock net, and for starting new clock nets and the total number of sinks in a net exceeds said upper limit, until said each sink has been assigned.

18. The computer system as set forth in claim 16 wherein said means for making an initial assignment further comprises:

means for constructing a geometric tree structure having subtrees and tree nodes, said structure containing each sink, and for marking each tree node of said geometric tree structure with the estimated load of all sinks in the subtrees rooted at said tree node;

means for inserting subtree nodes rooted at the root of said geometric tree structure into a heap data structure sorted by said estimated loads;

means for removing the highest estimated load subtree node from said heap data structure, for dividing said subtree node into further subtree nodes rooted at said highest estimated load subtree node, and for inserting said divided subtree nodes in said sorted heap data structure;

means for repeating said removing, dividing, and inserting of the previous step until a desired number of subtree nodes are inserted in said heap; and means for designating each of said desired number of subtree nodes in said heap as a clock net with the sinks in each of said desired number of subtree nodes taken as said initial assignment of sinks to clock nets.

* * * * *